United States Patent
Lin et al.

(10) Patent No.: US 8,004,333 B2
(45) Date of Patent: Aug. 23, 2011

(54) POWER MANAGEMENT AND CONTROL APPARATUS FOR RESETTING A LATCHED PROTECTION IN A POWER SUPPLY UNIT

(75) Inventors: Tzu-Chen Lin, Chupei (TW); Pei-Lun Huang, Chupei (TW)

(73) Assignee: Richtek Technology Corporation, Chupei, Hsinchu (TW)

( * ) Notice: Subject to any disclaimer, the term of this patent is extended or adjusted under 35 U.S.C. 154(b) by 75 days.

(21) Appl. No.: 12/654,055

(22) Filed: Dec. 9, 2009

(65) Prior Publication Data

US 2010/0141320 A1    Jun. 10, 2010

(30) Foreign Application Priority Data

Dec. 9, 2008  (TW) ............................... 97221985 U

(51) Int. Cl.
*H03K 3/02*    (2006.01)
(52) U.S. Cl. ....................................... 327/198; 327/143
(58) Field of Classification Search .................... 327/198
See application file for complete search history.

(56) References Cited

U.S. PATENT DOCUMENTS

| | | | | |
|---|---|---|---|---|
| 5,485,111 | A * | 1/1996 | Tanimoto | 327/143 |
| 6,621,311 | B2 * | 9/2003 | Jeon | 327/142 |
| 6,690,220 | B2 * | 2/2004 | Kuboshima et al. | 327/198 |
| 7,453,295 | B2 * | 11/2008 | Hotaka | 327/143 |
| 7,675,331 | B2 * | 3/2010 | Jung | 327/143 |

* cited by examiner

*Primary Examiner* — Hai L Nguyen
(74) *Attorney, Agent, or Firm* — Bacon & Thomas, PLLC

(57) ABSTRACT

A controller which has functions of remote control, multiple protection and PWM inside. The controller can shut down and latch the converter, when a failure happens (such as under voltage and over voltage of output, and over power protection). But, under-voltage and over-power protection will also happen when Vin is decreased by AC interruption or Vin source is removed. This invention is to provide a method to reset the latch protection by detecting Vin and Vo voltage.

6 Claims, 3 Drawing Sheets

POWER MANAGEMENT AND CONTROL APPARATUS FOR RESETTING A LATCHED PROTECTION IN A POWER SUPPLY UNIT

FIELD OF THE INVENTION

This invention relates to a novel power management and control apparatus, and more particularly, to a device for resetting a latch protection in a power supply unit.

BACKGROUND OF THE INVENTION

Conventional personnel computer (PC) or other electronic equipment usually has a power management and control apparatus for power saving. Conventional power supply unit has two converters, one is used for main power and the other, the smaller one, is used for standby power. The power management and control apparatus is powered by the standby power. When PC or other electronic equipment operates, the power supply unit provides main power. When the system is in standby status, the main power of the power supply unit will be shut down. Only standby power is provided for the power management and control apparatus.

Conventional power supply unit further has protection circuit device to provide protection function when a failure (such as over-voltage, over-current, under-voltage, over-power) occurs. There are two types of protection circuit, latch and non-latch. A latch type protection circuit can latch the protection circuit and shut down the power when a failure occurs. After the failure is repaired, the power needs to be restarted to recover since the power will not be recovered automatically. A non-latch type protection circuit can activate the protection function and stop providing power when a failure occurs. After the failure is repaired, the power will be provided automatically.

Although the latch type protection circuit can provide reliable protection for the components of the power supply unit, the supply of the power can not be recovered automatically when the failure is repaired once the protection function is activated. An additional procedure to restart the power is required to recover the power. Further, when manufacturing the power supply unit with latch type protection circuit used for such as PC, the power needs to be turned on and off for testing if the protection function is operated normally, which is time-consuming.

In order to overcome the above defects of latch type protection circuit, one conventional technology provides an additional time-delay circuit. That conventional technology uses the time-delay circuit to delay the shutdown control signal when the protection circuit latch is going to be occurred due to an AC interruption or a removal of the input voltage, to avoid the latch action in this situation. However, the additional delay time is still time-consuming. Therefore, what is needed is a simpler and more economic power supply unit protection circuit device.

SUMMARY OF THE INVENTION

The main objective of the present invention is to provide a novel power management and control apparatus, more specifically, to provide a device for resetting a latch protection in a power supply unit.

The power management and control apparatus has functions of remote control, multiple protection and pulse width modulation (PWM) inside. The power management and control apparatus can shut down and latch the converter, when a failure happens (such as over-voltage, under-voltage, or over-power). However, under-voltage and over-power protection can also happen when input voltage Vin is decreased by AC interruption or input voltage source is removed. Therefore, the present invention provides a device for resetting a latch protection by detecting the input voltage Vin and output voltage Vo.

In accordance with one aspect of the invention, there is provided a power management and control apparatus, which includes power-on "ON/OFF" signal line, under-voltage protection "UVP" signal line, over-voltage protection "OVP" signal line, over-power protection "OPP" signal line, input voltage "Vin" signal line, output voltage "Vo" signal line, power-on reset "POR" signal line, reset control "reset" signal line, and enable "EN" signal line. The power management and control apparatus further includes a reset unit, a flip-flop, a plurality of logic gates, a converter, a pulse width modulation (PWM) controller. When a failure occurs (such as over-voltage, under-voltage, or over-power), the under-voltage protection, over-voltage protection, or over-power protection will be activated, and then through the actions from the flip-flop, logic gates, signal EN, and the PWM controller, to shun down or latch the converter. In the situation that Vin is decreased by AC interruption or the input voltage source is removed, Vin will decrease to a predefined value, and Vo will decrease as well. At this moment, the protection of UVP will be activated, and the PWM controller will be latched. When Vo is decreased to a predefined value, the reset signal will be activated, and after a short period of time, it will enter into a "restart" status, that is, the power is restarted through the actions from the flip-flop, logic gates, signal EN, and to the PWM controller.

In accordance with another aspect of the invention, there is provided a power management and control apparatus, which includes UVP/OPP signal line, EN signal line, Vin signal line, Vo signal line, under input voltage UVin signal line, and reset control "reset" signal line. The power management and control apparatus further includes two comparators, a flip-flop, and a plurality of logic gates. When a failure (under-voltage or over-power) occurs and Vin is not under the predefined value, "reset" signal will not be generated. However, when Vin is under the predefined value, UVin signal will be activated. When a failure (under-voltage or over-power) occurs, the PWM controller will be latched and Vo will continue to decrease. Then, when a comparator detects that Vo is decreased to the predefined value, "reset" signal will be activated, and after a short period of time, it will enter into "restart" status to reset a latch protection and restart the PWM controller and restart the power.

BRIEF DESCRIPTION OF DRAWINGS

The objections, functions, features and advantages of the invention will be appreciated more fully from the following description thereof with reference to the accompanying drawings wherein.

DETAILED DESCRIPTION OF SPECIFIC EMBODIMENTS

The following exemplary examples will be described in detail with the appended drawings in order to make the aforementioned objectives, functional features, and advantages more clearly understood.

Figure 1:
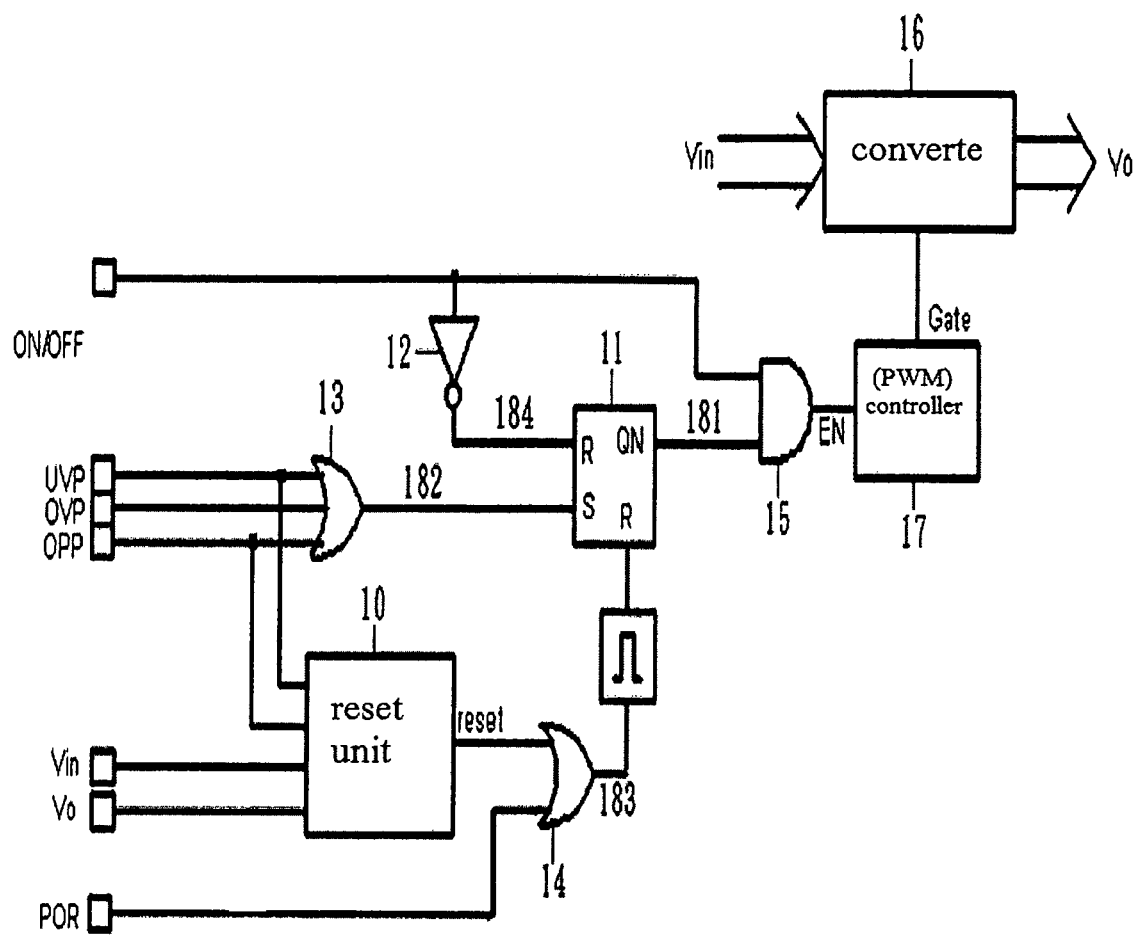
FIG. 1 shows a block diagram of the power management and control apparatus of the present invention.

FIG. 1 shows a block diagram of the power management and control apparatus of the present invention. The power management and control apparatus includes ON/OFF signal line, under-voltage protection (UVP) signal line, over-voltage protection (OVP) signal line, over-power protection (OPP) signal line, input voltage Vin signal line, output voltage Vo signal line, power-on reset POR signal line, reset control "reset" signal line, and enable EN signal line. The power management and control apparatus further includes a reset unit 10, a flip-flop 11, logic gates 12-15, a converter 16, and a pulse width modulation (PWM) controller 17.

The logic gate 13 can be an OR gate which receives the signal outputted from UVP, OVP, and OPP to output a control signal 182 that represents a failure status to the flip-flop 11. The flip-flop 11 can be a S-R flip-flop which receives the signal 182 outputted from the logic gate 13 to output a control signal 181 to the logic gate 15. The signal 181 and the ON/OFF signal together become an input of the logic gate 15. The logic gate 15 can be an AND gate which receives the signal 181 outputted from the flip-flop 11 and the ON/OFF signal 181 to output an enable EN signal to control the PWM controller 17.

The reset unit 10 is a device which resets a latch protection by detecting the input voltage Vin and the output voltage Vo. The reset unit 10 receives signals UVP, OPP, Vin, and Vo and outputs a reset control signal "reset" to the logic gate 14. The logic gate 14 can be an OR gate which receives the reset control signal "reset" outputted from the reset unit 10 and the POR signal to output a control signal 183 to the flip-flop 11. The flip-flop 11 changes the outputted signal 181 through the function of the signal 183. Further, by way of the logic gate 15, the flip-flop 11 changes the EN signal to achieve the goal of controlling the PWM controller 17. The logic gate 12 can be a NOT gate which receives the ON/OFF signal to output a control signal 184 to the flip-flop 11. The flip-flop 11 changes the outputted signal 181 through the action of the signal 184 as well and further changes the EN signal through the logic gate 15.

When a failure (such as over-voltage, under-voltage, or over power protection) occurs, the UVP, OVP, or OPP will be activated through the actions among the flip-flop 11, the logic gate 15, the EN signal, and the PWM controller 17, and will shut down and latch the converter 16. In the situation that the input voltage Vin is decreased by AC interruption or the input voltage source is removed, the output voltage Vo is also decreased and the UVP is activated. At this time, the PWM controller 17 is latched via EN signal. Then, a "reset" signal will be activated when Vo is decreased to a predefined value. After a small period of time, it will enter into a "restart" status, that is, the power is restarted through the actions from the flip-flop 11, the logic gate 15, the EN signal, and the PWM controller 17.

Figure 2:
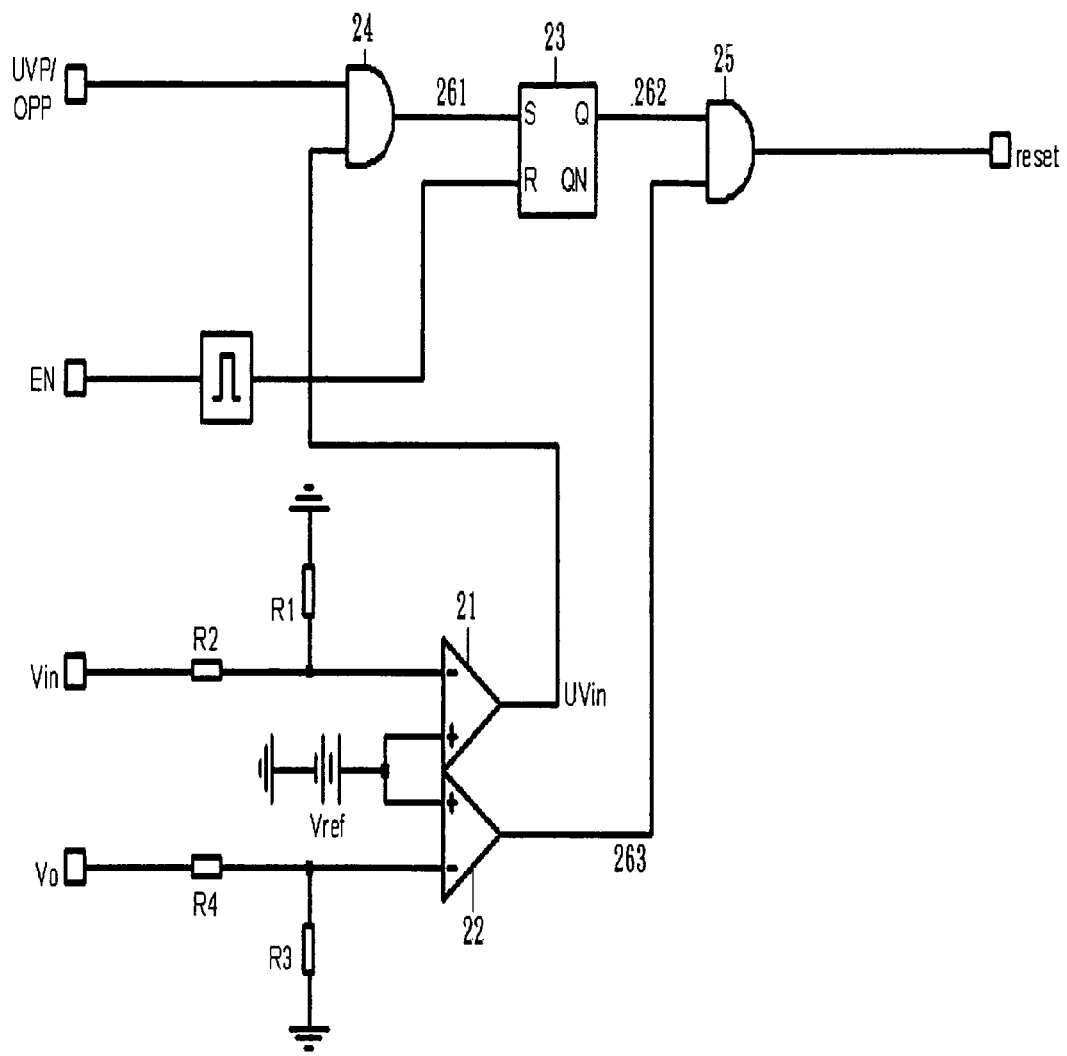
FIG. 2 shows an inner circuit diagram of reset unit 10 of the present invention.

FIG. 2 shows an inner circuit diagram of reset unit 10 of the present invention. The reset unit 10 includes UVP/OPP signal line, EN signal line, Vin signal line, Vo signal line, under input voltage UVin signal line, and reset control "reset" signal line. The power management and control apparatus further includes comparators 21 and 22, a flip-flop 23, and logic gates 24 and 25. The logic gate 24 can be an AND gate which receives the signals outputted from UVP/OPP and the signal UVin outputted from the comparator 21 to output a control signal 261 to the flip-flop 23. The flip-flop 23 can be a S-R flip-flop that receives the signal 261 outputted from the logic gate 24 and outputs a control signal 262 to logic gate 25. The signal 262 and the signal 263 outputted from the comparator 22 together become an input of the logic gate 25. The logic gate 25 can be an AND gate which receives the signal 262 outputted from the flip-flop 23 and the signal 263 outputted from the comparator 22 to output a reset control "reset" signal to reset the latch protection and restart the PWM controller 17. Vin is connected to the "−" inverse terminal of the comparator 21, Vo is connected to the "−" inverse terminal of the comparator 22, and the "+" terminals of two comparators 21 and 22 are jointly connected to a reference voltage Vref.

In FIG. 2, the comparator 21 is used to detect if Vin is in under-voltage status, that is, to detect if the input voltage is below a predefined threshold value. If UVP or OPP occurs and Vin is not below the predefined threshold value, an error signal will be generated to show over-power or short case. At this time, it is reasonable to shut down power and latch the protection status. In other case, if Vin is below the predefined threshold value and then UVP occurs, it means that no error happens, the latch protection will need to be reset when Vin is recovered. The comparator 22 detects if Vo is in a very low status. If this is the case, a "reset" signal is sent to reset the latch protection and turns on the PWM controller.

If UVP or OPP occurs and Vin is not below the predefined threshold value, the "reset" signal will not be generated (in low electric potential). In other case, if Vin is below the predefined threshold value, UVin will be set to high electric potential. If UVP or OPP occurs, the PWM controller will be latched and Vo will continue to decrease. When the comparator 22 detects that Vo is decreased to the predefined threshold value, the "reset" signal will be activated (in high electric potential). After a short period of time, it will enter into a "restart" status. In other words, the UVP which is increased to high electric potential will affect the output of the flip-flop 23 and further change the EN signal to activate the latch protection. When Vin is decreased to a predefined threshold value, if no error occurs in the output terminal, Vo will be slowly decreased, and the comparator 22 will detects that if Vo is in quite low status. If it is the case, the "reset" signal will be set to high electric potential and be transferred to reset the latch protection and restart the PWM controller so as to restart the power.

Figure 3:
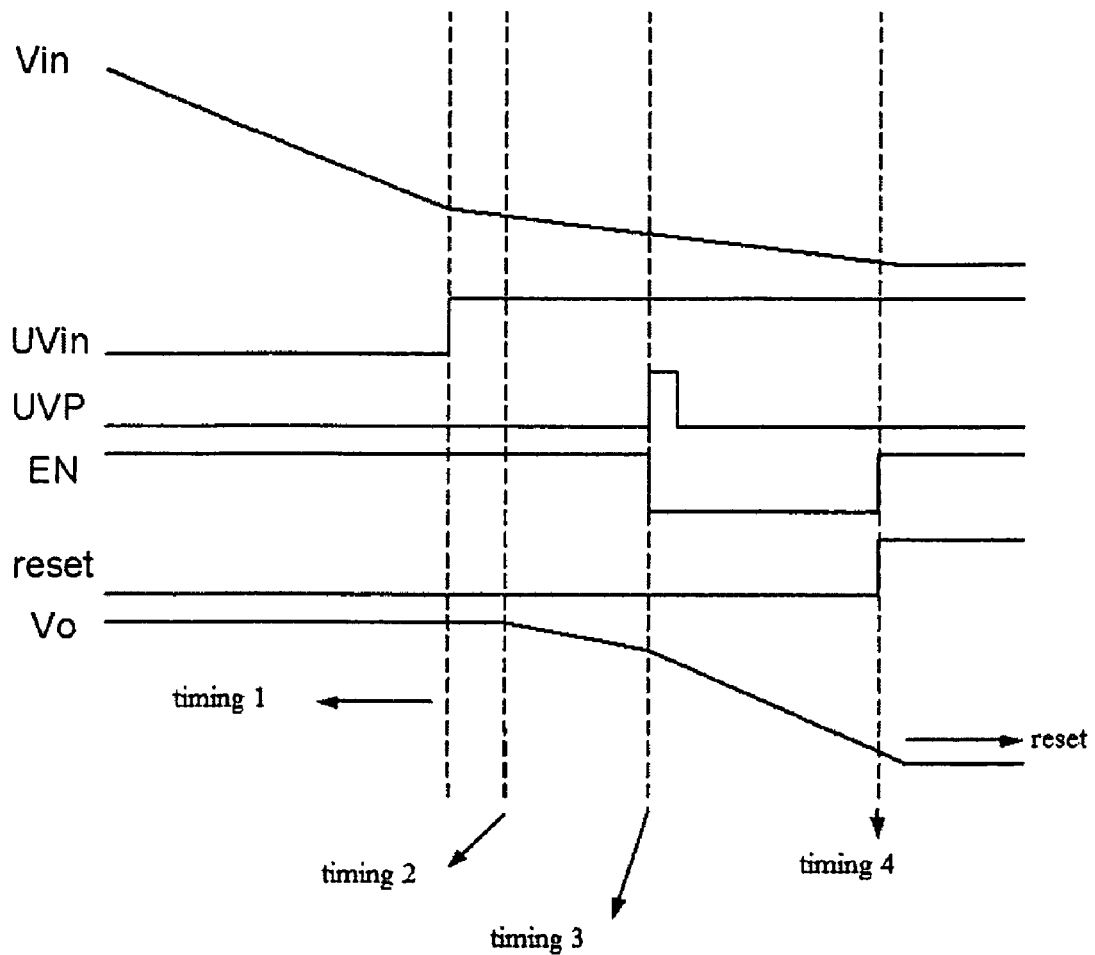
FIG. 3 shows the timing diagram of the reset function of the present invention.

FIG. 3 shows the timing diagram of the reset function of the present invention. The signals from top to bottom are input voltage Vin, under input voltage UVin, under voltage protection UVP, enable EN, reset control signal "reset", and output voltage Vo. In timing 1, the power good (PG) signal is decreased to low electric potential, and the loaded power of the system is removed. At this time, Vin is decreased to a predefined threshold value, UVin is increased to high electric potential, UVP is not activated (still in low electric potential), EN is in high electric potential, the "reset" is not activated (still in low electric potential), and Vo is in high electric potential.

In timing 2, the output voltage starts to be out of control and decrease. At this time, Vin continues to decrease, UVin is in high electric potential, UVP (or the protection of UVP) is not activated (in low electric potential), En is still in high electric potential, the "reset" is not activated (in low electric potential), and Vo starts to decrease.

In timing 3, UVP (or the protection of UVP) is activated and the PWM controller is shut down. At this time, Vin continues to decrease, UVin is in high electric potential, UVP is activated (it increases to high electric potential, but will back to low electric potential after a short period of time), EN is decreased to low electric potential, the "reset" is still not activated (in low electric potential), and Vo continues to decrease quickly.

Finally, in timing 4, the comparator U2 detects that Vo is decreased to a predefined threshold value, and the "reset" is activated (it increases to high electric potential). At this time, since the activation of the "reset" signal delays for a short period of time, Vin continues to decrease, but it will enter into a restart status after a short period of time, UVin will be in high electric potential, UVP will be in low electric potential, EN will be increased from low electric potential to high electric potential, the "reset" is activated (it is increased from low electric potential to high electric potential), and Vo continues to decrease quickly but will enter into a restart status after a short period of time.

A comprehensive summary of timing 1 to timing 4 is discussed below in order to explain in detail the operating process of the reset function of FIG. 3. First, when Vin is decreased to a predefined threshold value, UVin will be increased to high electric potential. If an under-voltage occurs, UVP will be activated and the PWM controller will be shut down. When Vin is decreased to a predefined threshold value, if no error occurs in the output terminal, Vo will be slowly decreased and the comparator will detect if Vo is in a quite low status. If this is the case, the "reset" will be increased to high electric potential and be transferred to reset the latch protection and restart the PWM controller so as to restart the power.

As stated above, the present power management and control apparatus has functions of remote control, multiple protection and PWM inside. The controller can shut down and latch the converter, when a failure (such as under voltage and over voltage of output, and over power protection) occurs. Moreover, the present power management and control apparatus further provides a device for resetting a latch protection by detecting input voltage and output voltage when the under-voltage and over-power protection occurs while Vin is decreased by AC interruption or the removal of Vin source. Therefore, the present invention provides a device for simply resetting the latch protection in a power supply unit.

While various exemplary embodiments of the present invention are described herein, it should be noted that the present invention may be embodied in other specific forms, including various modifications and improvements, without departing from the spirit and scope of the present invention. Thus, the described embodiments are to be considered in all respects only as illustrative and not restrictive.

What is claimed is:

1. A power management and control apparatus for resetting a latched protection in a power supply unit, comprising:
   a reset unit for detecting an input voltage and an output voltage to output a reset control signal to reset the latch protection;
   at least one failure protection unit for outputting a corresponding protection control signal when a failure happens; and
   a first logic circuit which receives the signals outputted from the reset unit and the at least one failure protection unit to output a control signal to control the power latch;
   wherein the first logic circuit latches the power supply unit by latching the control signal in OFF state when a failure happens and the input voltage is not lower than a predefined threshold value; and the first logic circuit will reset the latched protection of power when a failure happens and the input voltage is lower than a predefined threshold value.

2. A power management and control apparatus according to claim 1, wherein the at least one failure protection unit is selected from the group consisting of: an under-voltage protection unit (UVP), an over-voltage protection unit (OVP), and an over-power protection unit (OPP).

3. A power, management and control apparatus according to claim 1, wherein the reset unit comprising:
   a first comparator for detecting the input voltage and comparing it to a reference voltage to output a first compare signal;
   a second comparator for detecting the output voltage and comparing it to the reference voltage to output a second compare signal; and
   a second logic circuit for outputting the reset control signal based on the protection control signal of the at least one failure protection unit, the first compare signal, and the second compare signal.

4. A power management and control apparatus according to claim 3, wherein the second logic circuit comprising:
   a first logic gate which receives the protection control signal of the at least one failure protection unit and the first compare signal to output a first output signal;
   a flip-flop which receives the first output signal to output a second output signal; and
   a second logic gate which receives the first compare signal and the second compare signal to output the reset control signal.

5. A power management and control apparatus according to claim 4, wherein the received protection control signal is an UVP signal or an OPP signal.

6. A power management and control apparatus according to claim 1, wherein the first logic circuit comprising:
   a third logic gate which receives an ON/OFF signal to output a third output signal;
   a fourth logic gate which receives the signal of the at least one failure protection unit to output a fourth output signal;
   a fifth logic gate which receives the reset control signal of the reset unit to output a fifth output signal;
   a flip-flop which receives the third output signal, the fourth output signal, and the fifth output signal to output a seventh output signal; and
   a sixth logic gate which receives the seventh output signal and the ON/OFF signal to output a sixth output signal to control the power latch.

* * * * *